US009704708B2

(12) United States Patent
Dube et al.

(10) Patent No.: US 9,704,708 B2
(45) Date of Patent: Jul. 11, 2017

(54) HALOGENATED DOPANT PRECURSORS FOR EPITAXY

(71) Applicant: Applied Materials, Inc., Santa Clara, CA (US)

(72) Inventors: Abhishek Dube, Belmont, CA (US); Yihwan Kim, San Jose, CA (US); Xuebin Li, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 5 days.

(21) Appl. No.: 14/794,914

(22) Filed: Jul. 9, 2015

(65) Prior Publication Data

US 2016/0013274 A1  Jan. 14, 2016

Related U.S. Application Data

(60) Provisional application No. 62/023,448, filed on Jul. 11, 2014.

(51) Int. Cl.
*H01L 21/20* (2006.01)
*H01L 21/36* (2006.01)
*H01L 21/02* (2006.01)
*H01L 21/3065* (2006.01)
*C23C 16/24* (2006.01)
*H01L 21/3213* (2006.01)

(52) U.S. Cl.
CPC ........ *H01L 21/02579* (2013.01); *C23C 16/24* (2013.01); *H01L 21/0262* (2013.01); *H01L 21/02532* (2013.01); *H01L 21/02576* (2013.01); *H01L 21/3065* (2013.01); *H01L 21/32135* (2013.01)

(58) Field of Classification Search
CPC ........ H01L 21/0262; H01L 21/02381; H01L 21/02532; H01L 21/02576; H01L 21/02579; H01L 29/7848; H01L 29/66628
See application file for complete search history.

(56) References Cited

U.S. PATENT DOCUMENTS

| 7,713,881 | B2 | 5/2010 | Paranjpe et al. |
| 2007/0161216 | A1* | 7/2007 | Bauer .................... C30B 25/02 438/503 |
| 2007/0287272 | A1* | 12/2007 | Bauer ............... H01L 21/02529 438/485 |
| 2011/0117732 | A1* | 5/2011 | Bauer ............... H01L 21/02381 438/507 |
| 2011/0124169 | A1 | 5/2011 | Ye et al. |
| 2012/0202338 | A1 | 8/2012 | Ye et al. |
| 2012/0247386 | A1 | 10/2012 | Sanchez et al. |

* cited by examiner

*Primary Examiner* — Zandra Smith
*Assistant Examiner* — John M Parker
(74) *Attorney, Agent, or Firm* — Patterson + Sheridan, LLP

(57) ABSTRACT

A method for forming a film on a substrate is provided. The method includes positioning a substrate within a processing volume of a process chamber and heating the substrate. The method further includes forming a semiconductor film on the substrate by exposing the substrate to two or more reactants including a silicon source and a halogenated dopant source. The semiconductor film includes one or more epitaxial regions and one or more non-epitaxial regions.

20 Claims, 2 Drawing Sheets

HALOGENATED DOPANT PRECURSORS FOR EPITAXY

CROSS-REFERENCE TO RELATED APPLICATIONS

This application claims priority to U.S. Provisional Patent Application Ser. No. 62/023,448, filed on Jul. 11, 2014, which herein is incorporated by reference.

BACKGROUND

Field

Embodiments of the disclosure generally relate to the field of semiconductor manufacturing processes and devices, and more particularly, to methods for forming silicon-containing epitaxial layers for semiconductor devices.

Description of Related Art

Size reduction of metal-oxide-semiconductor field-effect transistors (MOSFETs) has enabled the continued improvement in speed performance, density, and cost per unit function of integrated circuits. One way to improve transistor performance is through application of stress to the transistor channel region. Stress distorts (i.e., strains) the semiconductor crystal lattice, and the distortion, in turn, affects the band alignment and charge transport properties of the semiconductor, By controlling the magnitude of stress in a finished device, manufacturers can increase carrier mobility allowing for faster device performance.

One approach of introducing stress into the transistor channel region is to incorporate a dopant into the region during formation of the region. The dopant can occupy a lattice site in a semiconductor crystal. The different size of the dopant atoms relative to the other repeating units, such as silicon atoms, in the crystal structure causes the strain that increases the carrier mobility. For example, phosphorous atoms can be used as dopants to strain a primarily silicon semiconductor crystal lattice.

A silicon layer doped with phosphorous atoms can be formed using an epitaxial process, such as a selective epitaxial process. A selective epitaxial process can include a deposition step and an etching step to produce a crystalline layer. Often, a goal of an epitaxial deposition and etch is to produce an epitaxial layer with high strain and low resistivity allowing for faster switching speeds and low power consumption in the devices using the epitaxial layer. Creating the epitaxial layer with high strain can be an expensive process due to the amount of dopant precursor needed as well as the time that for the dopant concentrations in the epitaxial layers to reach the specified level. Creating epitaxial layers with low resistivity can also be an expensive process because additional steps after etching are often required when etching undesirably raises the resistivity of the epitaxial layers.

Therefore, there is a need for a method and apparatus for reducing the costs of creating epitaxial layers with high strain and low resistivity.

SUMMARY

Embodiments of the present disclosure provide methods for forming silicon-containing epitaxial layers for semiconductor devices. In one embodiment, a method for forming a film on a substrate includes positioning a substrate within a processing volume of a process chamber and heating the substrate. The method further includes forming a semiconductor film on the substrate by exposing the substrate to two or more reactants including a silicon source and a halogenated dopant source. The semiconductor film includes one or more epitaxial regions and one or more non-epitaxial regions.

In another embodiment, a method of etching a film on a substrate includes positioning a substrate within a processing volume of a process chamber and heating the substrate. The method further includes selectively etching a semiconductor film formed on the substrate. The semiconductor film has one or more epitaxial regions including silicon and a dopant and one or more non-epitaxial regions. The selectively etching includes exposing the substrate to an etchant including the dopant and a halogen to remove the one or more non-epitaxial regions from the substrate.

In yet another embodiment, a method for forming a film on a substrate includes positioning a substrate within a processing volume of a process chamber and heating the substrate. The method further includes forming a semiconductor film on the substrate by exposing the substrate to two or more reactants including a silicon source and a halogenated dopant source. The semiconductor film includes one or more epitaxial regions of strained silicon and one or more non-epitaxial regions. The method further includes selectively etching the semiconductor film with the halogenated dopant source to remove the one or more non-epitaxial regions from the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized in other embodiments without specific recitation.

DETAILED DESCRIPTION

Figure 1:
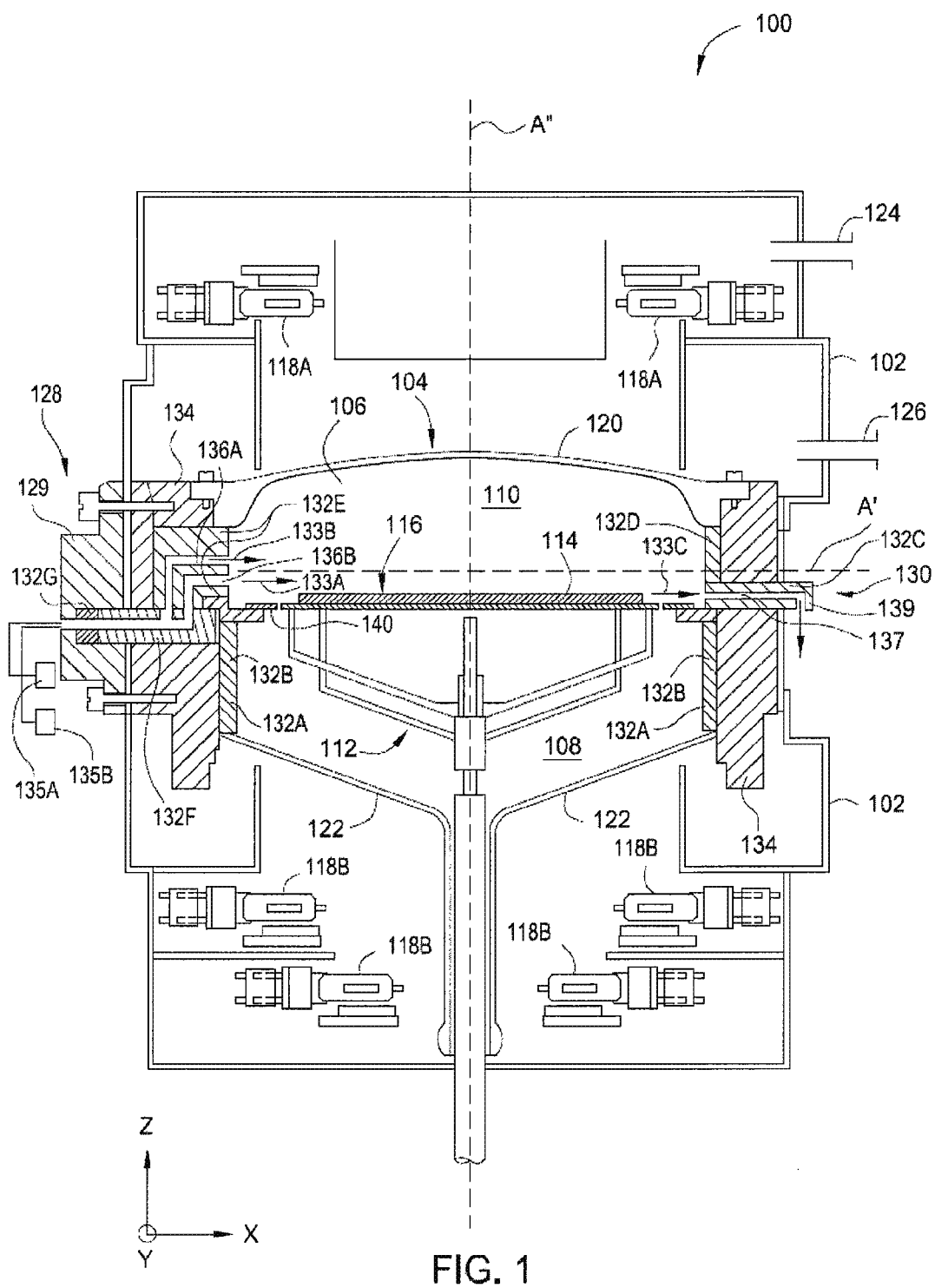
FIG. 1 is a schematic side cross-sectional view of an exemplary process chamber that may be used to practice various embodiments of this disclosure.

Embodiments of the present disclosure provide methods for forming silicon-containing epitaxial layers for semiconductor devices. The methods include forming a silicon-containing film on a substrate using a halogenated dopant source as a reactant during the epitaxial deposition and then using a halogenated compound including the dopant atom from the deposition to selectively etch non-epitaxial regions from the substrate.

FIG. 1A is a schematic side cross-sectional view of an exemplary process chamber 100 that may be used to practice various embodiments of the deposition process discussed in this disclosure. The process chamber 100 may be utilized for performing chemical vapor deposition, such as epitaxial deposition and etch processes, as well as other processes. Non-limiting examples of the suitable process chamber may include the RP EPI reactor, Elvis chamber, and Lennon chamber, which are all commercially available from Applied Materials, Inc. of Santa Clara, Calif. While the process chamber 100 is described below to be utilized to practice various embodiments described herein, other semiconductor process chambers from different manufacturers may also be used to practice the embodiment described in this disclosure. The process chamber 100 may be added to a CENTURA® integrated processing system available from Applied Materials, Inc., of Santa Clara, Calif.

The chamber 100 includes a housing structure 102 made of a process resistant material, such as aluminum or stainless steel. The housing structure 102 encloses various functioning elements of the process chamber 100, such as a quartz chamber 104, which includes an upper chamber 106, and a lower chamber 108, in which a processing volume 110 is contained. A substrate support 112 is adapted to receive a substrate 114 within the quartz chamber 104. The substrate support 112 can be fabricated from a ceramic material or a graphite material coated with a silicon material, such as silicon carbide. Reactive species from precursor reactant materials can be applied to a processing surface 116 of the substrate 114, and byproducts may be subsequently removed from the processing surface 116.

Heating of the substrate 114 and/or the processing volume 110 may be provided by radiation sources, such as upper lamp modules 118A and lower lamp modules 118B. In one embodiment, the upper lamp modules 118A and lower lamp modules 118B are infrared lamps. Radiation from lamp modules 118A and 118B travels through an upper quartz window 120 of upper chamber 106, and through a lower quartz window 122 of lower chamber 108. In some embodiments, cooling gases for the upper chamber 106 can enter through an inlet 124 and exit through an outlet 126.

Reactive species are provided to the quartz chamber 104 by a gas distribution assembly 128, and processing byproducts are removed from processing volume 110 by an exhaust assembly 130, which is typically in communication with a vacuum source (not shown). Precursor reactant materials and etching materials, as well as diluent, purge, and vent gases for the chamber 100, enter through the gas distribution assembly 128 and exit through the exhaust assembly 130. The chamber 100 also includes multiple liners 132A-132G that shield the processing volume 110 from metallic walls 134 that surround the processing volume 110. In one embodiment, the liners 132A-132G comprise a process kit that covers all metallic components that may be in communication with or otherwise exposed to the processing volume 110.

The one or more gases can be provided to the processing volume 110 from a first gas source 135A and a second gas source 135B through a baffle liner 132G, an inject insert liner assembly 132F and through the one or more openings 136A and 136B formed in an injector liner 132E. The one or more openings 136A and 136B formed in the injector liner 132E are coupled to outlets configured for a laminar flow path 133A or a jetted flow path 1338. The openings 136A and 136B may be configured to provide individual or multiple gas flows with varied parameters, such as velocity, density, or composition. In one embodiment where multiple openings 136A and 136B are adapted, the openings 136A and 136B may be distributed along a portion of the gas distribution assembly 128 (e.g., injector liner 132E) in a substantial linear arrangement to provide a gas flow that is wide enough to substantially cover the diameter of the substrate. For example, each of the openings 136A and 136B may be arranged to the extent possible in at least one linear group to provide a gas flow generally corresponding to the diameter of the substrate. Alternatively, the openings 136A and 136B may be arranged in substantially the same plane or level for flowing the gas(es) in a planar, laminar fashion.

Each of the flow paths 133A, 133B are configured to flow across an axis A' in a generally planar, laminar flow fashion to the exhaust liner 132D. The axis A' is substantially normal to a longitudinal axis A" of the chamber 100. The flow paths 133A, 133B flow into a plenum 137 formed in the exhaust liner 132D and culminate in an exhaust flow path 133C. The plenum 137 is coupled to an exhaust or vacuum pump (not shown). In one embodiment, the plenum 137 is coupled to a manifold 139 that directs the exhaust flow path 133C in a direction that is substantially parallel to the longitudinal axis A". At least the inject insert liner assembly 132F may be disposed through and partially supported by an inject cap 129. In some embodiments, the process chamber 100 can be adapted to supply one or more liquids for processes, such as deposition and etch processes. Furthermore, although only two gas sources 135A, 135B are shown in FIG. 1, process chamber 100 could be adapted to accommodate as many fluid connections as needed for the processes executed in the chamber 100.

Figure 2:
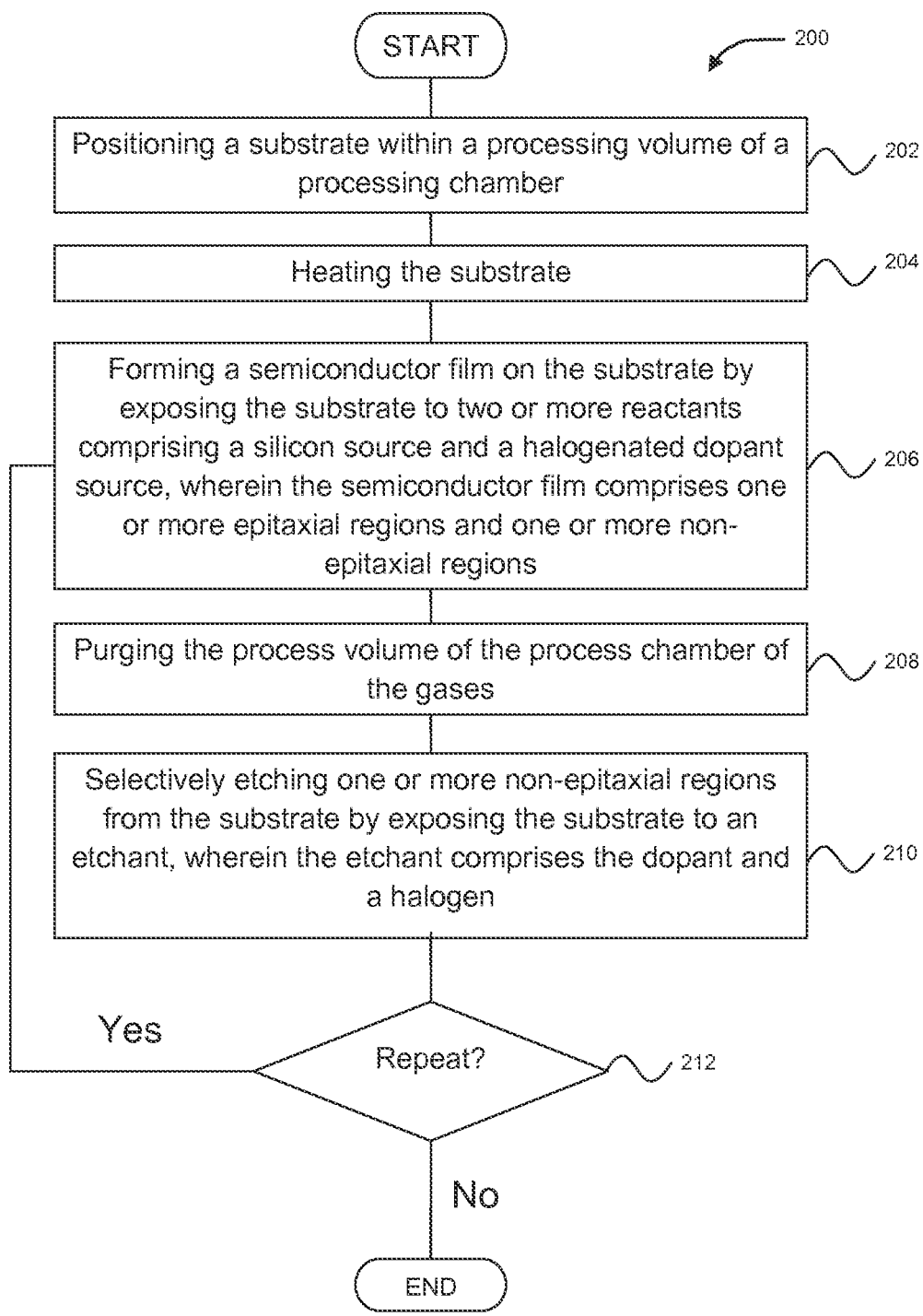
FIG. 2 is a process flow diagram, according to one embodiment.

Referring to FIGS. 1 and 2, a method 200 is described for forming a film on a substrate. Although the method is described in conjunction with reference to the chamber 100 of FIG. 1, persons skilled in the art would understand that any suitably adapted chamber configured to perform the method blocks, in any order, is within the scope of the implementations disclosed. Method 200 could be executed in process chamber 100.

At block 202, the substrate 114 is positioned within the processing volume 110 of the process chamber 100. The substrate 114 can be placed on the substrate support 112 for processing. At block 204, the substrate 114 is heated to a predetermined temperature. The process chamber 100 may be kept at a temperature in the range from about 250° C. to about 1,000° C., which can be tailored to a particular conducted process. The appropriate temperature to conduct an epitaxial process may depend on the particular sources used to deposit and/or etch the semiconductor materials. In various embodiments, the temperature to pre-heat the process chamber 100 and substrate 114 is about 750° C. or less, for example about 550° C. or less, for example from about 400° C. to about 550° C. It may be beneficial to minimize the thermal budget of the final device by heating the substrate to the lowest temperature sufficient to thermally decompose process reagents and deposit a layer on the substrate 114, although increased temperatures generally may lead to increased throughput. During processing, the process chamber 100 may be maintained at a pressure from about 0.1 Torr to about 760 Torr, for example from about 1 Torr to about 100 Torr, for example about 40 Torr to about 50 Torr. In some embodiments, pressures greater than about 100 Torr, for example about 300 Torr to about 760 Torr can be used.

At block 206, a semiconductor film is formed on the substrate 114 by exposing the substrate 114 to two or more deposition gases. The semiconductor film includes one or more epitaxial regions and one or more non-epitaxial regions. The epitaxial regions can be strained silicon layers that form on crystalline portions of the substrate while the non-epitaxial regions can be silicon layers that form on amorphous or polycrystalline portions of the substrate. In some embodiments, the epitaxial and non-epitaxial regions can be silicon-germanium layers, or germanium layers. The deposition gases may include two or more reactants, such as a silicon source and a halogenated dopant source. The deposition gases could further include one or more carrier gases. The deposition gases may be provided to the processing volume 110 from the gas source 135A and/or gas source 135B through the baffle liner 132G, the inject insert liner assembly 132F and through the one or more openings 136A and/or 136B formed in the injector liner 132E. The deposition gas may flow across the processing surface 116 of the substrate 114, in a flow path 133A or 133B substantially parallel to the processing surface 116 or at an angle thereto, towards the plenum 137 formed in the exhaust liner 132D. In some embodiments, the process chamber 100 can be adapted to supply one or more liquid during the deposition process. Furthermore, in some embodiments, the process chamber 100 can be adapted to accommodate as many fluid connections as needed for the processes executed in the chamber 100.

In cases where a silicon-containing material is to be formed, the deposition gas may contain at least a silicon source and a carrier gas, and may optionally contain at least one secondary elemental source, such as a germanium source and/or a carbon source. In cases where a germanium-containing material is to be formed, the deposition gas may contain at least a germanium source and a carrier gas (with or without the existence of silicon source).

The silicon source may be provided into the process chamber 100 at a rate in a range from about 5 sccm to about 500 sccm. In some embodiments, the silicon source is provided into the process chamber 100 at a rate of about 10 sccm to about 300 sccm, such as about 50 sccm to about 200 sccm, for example, about 100 sccm. Silicon sources useful to deposit silicon-containing compounds can include silanes, halogenated silanes and organosilanes. Silanes may include silane ($SiH_4$) and higher silanes with the chemical formula $Si_xH_{(2x+2)}$, such as disilane ($Si_2H_6$), trisilane ($Si_3H_8$), and tetrasilane ($Si_4H_{10}$), or other higher order silane such as polychlorosilane. Halogenated silanes may include compounds with the chemical formula $X'_ySi_xH_{(2x+2-y)}$, where X'=F, Cl, Br or I, such as hexachlorodisilane ($Si_2Cl_6$), tetrachlorosilane ($SiCl_4$), dichlorosilane ($Cl_2SiH_2$) and trichlorosilane ($Cl_3SiH$). Organosilanes may include compounds with the chemical formula $R_ySi_xH_{(2x+2-y)}$, where R=methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$) and hexamethyldisilane (($CH_3$)$_6Si_2$).

The silicon source may be provided into the process chamber 100 along with a carrier gas. The carrier gas may have a flow rate from about 1 SLM (standard liters per minute) to about 100 SLM, such as from about 3 SLM to about 30 SLM. Suitable carrier gases may include nitrogen ($N_2$), hydrogen ($H_2$), argon, helium, or combinations thereof. A carrier gas may be selected based on the reactants used and/or the process temperature during the epitaxial process.

The deposition gas may further include at least one halogenated dopant source to provide a source of elemental dopant, such as phosphorous, boron, arsenic, or antimony. Halogenated dopant sources that can be useful may include compounds with the chemical formula $DH_{(3-x)}X'_x$, where D is a dopant atom, such as phosphorous, boron, arsenic, or antimony, H is hydrogen, X' is a halogen, such as Cl, F, Br, or I, and x=1, 2, or 3. In some embodiments, the dopant atom can be any of the Group III or Group V elements. Other compounds that include the aforementioned dopant atoms and halogens but do not follow the formula in the preceding sentence can also be useful as an dopant source, such as $PCl_5$.

Dopants provide the deposited silicon-containing compounds with various conductive characteristics, such as directional electron flow in a controlled pathway through the electronic device. Films of the silicon-containing compounds can be doped with particular dopants to achieve the specific conductive characteristics. The halogenated dopant source may be provided into the process chamber 100 at a rate in the range from about 0.1 sccm to about 600 sccm, such as from about 0.5 sccm to about 150 sccm, for example, about 3 sccm to about 100 sccm.

The use of halogenated dopant sources has been observed by the present inventors to provide advantages for depositing the dopants into the epitaxial layer when compared to conventional non-halogenated dopant sources. Notably, increased strain and dopant concentration has been observed in the epitaxial layers as well as beneficial resistivity levels. Table 1 below illustrates one example of the advantages provided by using a halogenated dopant source to deposit an epitaxial layer as opposed to using a conventional non-halogenated dopant source to deposit an epitaxial layer. Table 1 shows the film properties of a silicon-phosphorous (SiP) epitaxial layer formed with a conventional dopant source, phosphine ($PH_3$) (see sample 1), compared to a SiP epitaxial layer formed with a halogenated dopant source, phosphorous trichloride ($PCl_3$) (see sample 2).

TABLE 1

| | DS (sccm) | $PH_3$ (sccm) | HCl (sccm) | $PCl_3$ (sccm) | Time (s) | Thickness [Å] | Strain (%) | Resistivity (mΩ-cm) | [P] (atoms/cc) |
|---|---|---|---|---|---|---|---|---|---|
| 1 | 120 | 60 | 30 | 0 | 600 | 457 | 0.36% | 0.31 | $8.5 * 10^{20}$ |
| 2 | 120 | 0 | 0 | 20 | 300 | 257 | 1.40% | 0.40 | $3.0 * 10^{21}$ |

In both samples shown above in Table 1, disilane (acronym as DS) was provided at a flow rate of 120 sccm, and hydrogen gas, which serves as a carrier gas, was provided at a flow rate of 8 SLM. Also, in both samples the process chamber, such as chamber 100, was maintained at 570° C. and 12 Torr. Sample 1 shows typical results for incorporating phosphorous into a silicon-containing epitaxial layer using disilane, phosphine ($PH_3$), and hydrochloric acid (HCl). A flow of 60 sccm of $PH_3$ and 30 sccm of HCl for 600 s was used to deposit the SiP epitaxial layer in sample 1. Although, the SiP epitaxial layer produced in sample 1 has a favorable resistivity of 0.31 mΩ-cm, the tensile strain of 0.36% as well as the phosphorous concentration of $8.5*10^{20}$ atoms/cc in the layer provide insufficient enhancement of the electron mobility. Conversely, sample 2 provides results for a SiP epitaxial layer having favorable resistivity, tensile strain, and phosphorous concentration. A flow of only 20 sccm of $PCl_3$ for 300 s produced a SiP epitaxial layer having a resistivity of 0.40 mΩ-cm, a tensile strain of 1.40%, and a phosphorous concentration in the SiP epitaxial layer of $3*10^{21}$ atoms/cc. Notably, the results in sample 2 provide a tensile strain and phosphorous concentration over three times higher than the phosphorous concentration in sample 1 even with the lower flow rate of the dopant source (60 sccm of $PH_3$ in sample 1 compared to only 20 sccm of $PCl_3$ in sample 2) applied for less time (600 s in sample 1 compared to only 300 s in sample 2).

In embodiments, using disilane as the silicon source, $PCl_3$ may be introduced to the process chamber 100 at between about 10 sccm to about 60 sccm, for example from about 20 to 40 sccm. Furthermore, when disilane is used as the silicon source, the temperature in the process chamber 100 may be maintained at between about 450° C. to 600° C., for example from about 550° C. to 575° C. and the pressure may be maintained between about 5 Torr to about 40 Torr, for example from about 10 Torr to about 20 Torr. Epitaxial depositions with $PCl_3$ may also be executed with other silanes, such as silane ($SiH_4$) and dichlorosilane ($H_2SiCl_2$). When silane is used as the silicon source, $PCl_3$ may be introduced to the process chamber 100 at between about 50 sccm to about 250 sccm, for example from about 100 to 150 sccm. Furthermore, when silane is used as the silicon source, the temperature in the process chamber 100 may be maintained at between about 600° C. to 700° C., for example from about 625° C. to 675° C. and the pressure may be maintained between about 50 Torr to about 200 Torr, for example from about 100 Torr to about 150 Torr. When dichlorosilane is used as the silicon source, $PCl_3$ may be introduced to the process chamber 100 at between about 20 sccm to about 100 sccm, for example from about 40 to 80 sccm. Furthermore, when dichlorosilane is used as the silicon source, the temperature in the process chamber 100 may be maintained at between about 600° C. to 700° C., for example from about 650° C. to 700° C. and the pressure may be maintained between about 150 Torr to about 600 Torr, for example from about 300 Torr to about 600 Torr.

In some embodiments, block 206 could further include exposing the substrate 114 to a non-halogenated dopant source. The present inventors have observed favorable results for resistivity and strain when exposing a substrate to a halogenated dopant source in combination with a non-halogenated dopant source. The halogenated dopant source and the non-halogenated dopant source can be provided concurrently to the processing volume 110 of the process chamber 100. Phosphorous-containing dopant sources useful as a non-halogenated dopant source may include phosphine. Boron-containing dopant sources useful as a non-halogenated dopant source include boranes and organoboranes. Boranes include borane, diborane, triborane, tetraborane and pentaborane, while alkylboranes include compounds with the chemical formula $R_xBH_{(3-x)}$, where R=methyl, ethyl, propyl or butyl and x=1, 2 or 3. Alkylboranes include trimethylborane (($CH_3)_3B$), dimethylborane (($CH_3)_2BH$), triethylborane (($CH_3CH_2)_3B$) and diethylborane (($CH_3CH_2)_2BH$). Non-halogenated dopant sources may also include arsine ($AsH_3$) and alkylphosphines, such as with the chemical formula $R_xPH_{(3-x)}$, where R=methyl, ethyl, propyl or butyl and x=1, 2 or 3. Alkylphosphines include trimethylphosphine (($CH_3)_3P$), dimethylphosphine (($CH_3)_2PH$), triethylphosphine (($CH_3CH_2)_3P$) and diethylphosphine (($CH_3CH_2)_2PH$). The non-halogenated dopant source may be provided into the process chamber 100 at a rate in the range from about 0.1 sccm to about 600 sccm, such as from about 200 sccm to about 400 sccm.

Table 2 below illustrates one example of the advantages provided by using a halogenated dopant source with a non-halogenated dopant source to deposit an epitaxial layer as opposed to only using a conventional non-halogenated dopant source to deposit an epitaxial layer. Table 2 shows the film properties of a SiP epitaxial layer formed with a conventional dopant source, phosphine ($PH_3$)(see sample 3), compared to a SiP epitaxial layer formed with a halogenated dopant source, phosphorous trichloride ($PCl_3$) in combination with a non-halogenated dopant source, phosphine (see sample 4).

TABLE 2

| | DS (sccm) | $PH_3$ (sccm) | $PCl_3$ (sccm) | Time (s) | Thickness [Å] | Strain (%) | Resistivity (mΩ-cm) |
|---|---|---|---|---|---|---|---|
| 3 | 120 | 300 | 0 | 300 | 270 | 1.16% | 0.39 |
| 4 | 120 | 300 | 20 | 300 | 212 | 1.82% | 0.41 |

In both samples shown above in Table 2, disilane (acronym as DS) was provided at a flow rate of 120 sccm, and hydrogen gas, which serves as a carrier gas, was provided at a flow rate of 8 SLM. Also, in both samples the process chamber was maintained at 570° C. and 12 Torr. Sample 3 shows typical results for incorporating phosphorous into a silicon-containing epitaxial layer using disilane and $PH_3$. A flow of 300 sccm of $PH_3$ and for 300 s was used to deposit the SiP epitaxial layer in sample 3. Although, the SiP epitaxial layer produced in sample 3 has a favorable resistivity of 0.39 mΩ-cm, the tensile strain of only 1.16% leaves ample room to improve the strain in order to further enhance the electron mobility in the epitaxial layer. Conversely, sample 4 provides results for a SiP epitaxial layer having favorable resistivity and tensile strain. A flow of only 20 sccm of $PCl_3$ in combination with the flow of 300 sccm of $PH_3$ for 300 s produced a SiP epitaxial layer having a resistivity of 0.41 mΩ-cm and a tensile strain of 1.82%. Notably, the tensile strain in sample 4 is over 50% higher times higher than the tensile strain in sample 3 even though the combined flow rate of the dopant source in sample 4 is only less than 10% higher than the flow rate of the dopant source in sample 3 (320 sccm of combined $PH_3$ and $PCl_3$ in sample 4 compared to 300 sccm of $PH_3$ in sample 3). Because strain in an epitaxial layer is generally related to dopant concentration in the layer, the strain results in sample 4 compared to sample 3 show that there was also a much more efficient incorporation of phosphorous into the epitaxial layer in sample 4 relative to the epitaxial layer of sample 3. An epitaxial deposition using $PCl_3$ in combination with $PH_3$ could also be executed with other silanes, such as silane and dichlorosilane.

At block 208, the processing volume 110 of the process chamber 100 can optionally be purged of the deposition gases from block 206. Exhaust assembly 130 could be used to purge the gases.

At block 210, the one or more non-epitaxial regions of the semiconductor film can be selectively etched from the substrate. Selectively etching the non-epitaxial regions from the substrate allows the epitaxial regions to remain on the substrate for further processing. In some embodiments, the one or more epitaxial regions comprise strained silicon layers and the one or more epitaxial regions have a dopant concentration of at least $1.0*10^{21}$ atoms per cubic centimeter. In some embodiments, the etchant can be a compound including a halogen and the dopant element incorporated into the epitaxial regions at block 206 (hereinafter a "halogenated dopant etchant"). In some embodiments, the halogenated dopant source and the halogenated dopant etchant are the same compound (e.g., $PCl_3$). Halogenated dopant etchants that can be useful can include compounds with the chemical formula $DH_{(3-x)}X'_x$, where D is a dopant atom, such as phosphorous, boron, arsenic, or antimony, H is hydrogen, X' is a halogen, such as Cl, F, Br, or I, and x=1, 2, or 3. In some embodiments, the dopant atom can be any of the Group III or Group V elements. In some embodiments, the dopant atom can be any of the Group III or Group V elements. Other compounds that include the aforementioned dopant atoms and halogens but do not follow the formula in the preceding sentence can also be useful as an etchant, such as $PCl_5$.

The present inventors have observed favorable results for resistivity when etching substrates having epitaxial and non-epitaxial regions with an etchant that is a halogenated dopant etchant. Table 3 below illustrates one example of the advantages provided by using a halogenated dopant etchant. Table 3 shows resistivity levels of a SiP epitaxial layer after being etched with (1) a conventional etchant (HCl, see sample 5) and (2) a halogenated dopant etchant ($PCl_3$, see sample 6).

TABLE 3

| | Etchant | Time (s) | Etch Rate [Å]/min | Resistivity Before Etch (mΩ-cm) | Resistivity After Etch (mΩ-cm) |
|---|---|---|---|---|---|
| 5 | HCl | 450 | 41.0 | 0.32 | 0.79 |
| 6 | $PCl_3$ | 600 | 45.8 | 0.32 | 0.33 |

In both samples shown above in Table 3, 120 sccm of disilane and 60 sccm of $PH_3$ were used to deposit 440 Å of SiP semiconductor films having epitaxial and non-epitaxial regions on identical substrates. Both depositions were carried out under identical conditions (e.g., pressure, temperature, flow rates). During the etching for both samples, the process chamber was maintained at 570° C. and 300 Torr. Although the temperature of 570° C. is the same as the temperature for the depositions mentioned above in reference to Tables 1 and 2, the etching may be carried out at a higher or lower temperature than the deposition. Sample 5 shows typical results for increases in resistivity after a silicon-containing epitaxial layer is etched with HCl as the resistivity of the epitaxial regions increases from 0.32 mΩ-cm to 0.79 mΩ-cm. Conversely, sample 6 shows only a negligible increase in resistivity from 0.32 mΩ-cm to 0.33 mΩ-cm for the silicon-containing epitaxial layer even though sample 6 was etched for a longer time at a higher etch rate. Halogenated dopant etchants, such as $PCl_3$, can alleviate the need to perform any post-etching processes to lower the resistivity, such as annealing, or from performing the etching and/or deposition processes at higher temperatures. Performing the etching and/or deposition processes at higher temperatures can lower the resistivity of the epitaxial layer, but the higher temperatures also lower the strain diminishing the carrier mobility and thus the device performance.

In embodiments, using $PCl_3$ as the etchant, $PCl_3$ may be introduced to the process chamber 100 at between about 50 sccm to about 300 sccm, for example from about 100 to 200 sccm. Furthermore, when $PCl_3$ is used as the etchant, the temperature in the process chamber 100 may be maintained at between about 550° C. to 700° C., for example from about 600° C. to 650° C. and the pressure may be maintained between about 100 Torr to about 300 Torr, for example from about 150 Torr to about 200 Torr.

At block 212, a decision can be made to repeat the deposition, optional purge, and etching blocks. For some embodiments, the formation of the epitaxial layers can benefit from a cyclical approach until the specified thickness of the epitaxial layers is reached or a set number of cycles of deposition and etch are completed. A controller and any necessary instrumentation could be used to make the decision at block 212. If a decision is made to repeat the deposition and etching processes, then blocks 206 through 210 can be repeated. Conversely, in some embodiments only a single deposition process and a single etching process can be used to yield an epitaxial layer meeting the given specifications.

The embodiments described herein illustrate numerous advantages over existing methods for creating epitaxial layers. Using a halogenated dopant source can be more efficient than using non-halogenated dopant sources for creating epitaxial layers with high strain and high dopant concentrations (i.e., $>1.0*10_{21}$). Table 1 illustrate this increased efficiency as the halogenated dopant source $PCl_3$ was at least three times more efficient at creating strain and incorporating phosphorous into a silicon-containing epitaxial layer than the conventional non-halogenated dopant source $PH_3$. The ability to create epitaxial layers with high strain and high dopant concentrations in less time and/or using less dopant source saves operating costs. Furthermore, using a halogenated dopant source in combination with a non-halogenated dopant source is also more efficient than using non-halogenated dopant sources for creating epitaxial layers with high strain and high dopant concentrations as was similarly illustrated in Table 2. Notably, the strain achieved for sample 4 shown in Table 2 from using a combination of a halogenated dopant source with a non-halogenated dopant source was even higher than the strain achieved for sample 2 shown in Table 1 from using only the halogenated dopant source. Consequently, for some processes, it may be suitable to use a combination of a halogenated dopant source with a non-halogenated dopant source while for other processes it may be suitable to only use the halogenated dopant source.

Etching with a halogenated dopant etchant provides the advantage of not undesirably increasing the resistivity of the epitaxial layer. Table 3 illustrated how conventional etchants, such as HCl, can more than double the resistivity of an epitaxial layer. Increases in resistivity can either cause additional process steps to lower the resistivity to be performed or create the unsatisfactory result of diminished device performance, such as increased power consumption. On the other hand, Table 3 also illustrated how using a halogenated dopant etchant, such as $PCl_3$, only results in an almost negligible increase in the resistivity. This almost negligible increase in resistivity can either allow for additional process processes to reduce the resistivity of the epitaxial layer to be reduced or skipped resulting in operational cost savings. For embodiments using the same compound as the dopant source and the etchant, such as $PCl_3$, further cost savings can be achieved because the number of materials needed to form the epitaxial layer is reduced.

While the foregoing is directed to embodiments of the present disclosure, other and further embodiments of the disclosure may be devised without departing from the basic scope thereof, and the scope thereof is determined by the claims that follow.

The invention claimed is:
1. A method of forming a film on a substrate, comprising:
    positioning a substrate within a processing volume of a process chamber;
    heating the substrate; and forming a semiconductor film on the substrate by supplying two or more reactants to the processing volume, the two or more reactants comprising a silicon source and a halogenated dopant source, and the semiconductor film including a dopant element from the halogenated dopant source, wherein the semiconductor film comprises one or more epitaxial regions and one or more non-epitaxial regions.

2. The method of claim 1, wherein the one or more epitaxial regions comprise strained silicon layers.

3. The method of claim 2, wherein the one or more epitaxial regions have a dopant concentration of at least $1.0*10^{21}$ atoms per cubic centimeter.

4. The method of claim 2, wherein the halogenated dopant source comprises a compound having a chemical formula of $DH_{(3-x)}X'_x$, where D is a Group III or Group V dopant element, H is hydrogen, X' is a halogen, and x=1, 2, or 3.

5. The method of claim 2, wherein the halogenated dopant source comprises phosphorous, boron, arsenic, or antimony.

6. The method of claim 2, wherein the halogenated dopant source comprises phosphorous trichloride.

7. The method of claim 6, wherein a flow rate of the phosphorous trichloride into the process chamber is between about 10 sccm and about 60 sccm.

8. The method of claim 6, further comprising:
supplying a non-halogenated dopant source to the processing volume while supplying the halogenated dopant source to the processing volume.

9. The method of claim 8, wherein the non-halogenated dopant source is phosphine.

10. The method of claim 2, further comprising selectively etching the semiconductor film with the halogenated dopant source to remove the one or more non-epitaxial regions from the substrate.

11. A method of etching a film on a substrate, comprising:
positioning a substrate within a processing volume of a process chamber;
heating the substrate;
forming a semiconductor film on the substrate by supplying two or more reactants to the processing volume, the two or more reactants comprising a silicon source and a halogenated dopant source, and the semiconductor film including a dopant element from the halogenated dopant source, wherein the semiconductor film comprises one or more epitaxial regions and one or more non-epitaxial regions; and
selectively etching the semiconductor film formed on the substrate, wherein the selectively etching comprises supplying an etchant comprising the dopant element and a halogen to the processing volume to remove the one or more non-epitaxial regions from the substrate.

12. The method of claim 11, wherein the one or more epitaxial regions comprise strained silicon layers and the one or more epitaxial regions have a dopant concentration of at least $1.0*10^{21}$ atoms per cubic centimeter.

13. The method of claim 12, wherein the etchant comprises a compound having a chemical formula of $DH_{(3-x)}X'_x$, where D is a Group III or Group V dopant element, H is hydrogen, X' is a halogen, and x=1, 2, or 3.

14. The method of claim 12, wherein the etchant comprises phosphorous, boron, arsenic, or antimony.

15. The method of claim 12, wherein the etchant comprises phosphorous trichloride.

16. The method of claim 12, wherein a resistivity of the one or more epitaxial regions is 0.5 mΩ-cm or less after the one or more non-epitaxial regions are removed by the etchant.

17. The method of claim 12, wherein a resistivity of the one or more epitaxial regions after the one or more non-epitaxial regions are removed is within 10% of the resistivity of the one or more epitaxial regions before the the etchant is supplied to the processing volume.

18. The method of claim 12, further comprising:
supplying a non-halogenated dopant source to the processing volume while supplying the halogenated dopant source to the processing volume.

19. A method of forming a film on a substrate, comprising:
positioning a substrate within a processing volume of a process chamber;
heating the substrate;
forming a semiconductor film on the substrate by supplying two or more reactants to the processing volume, the two or more reactants comprising a silicon source and a halogenated dopant source, and the semiconductor film including a dopant element from the halogenated dopant source, wherein the semiconductor film comprises one or more epitaxial regions of strained silicon and one or more non-epitaxial regions; and
selectively etching the semiconductor film with the halogenated dopant source to remove the one or more non-epitaxial regions from the substrate.

20. The method of claim 19, wherein the halogenated dopant source is phosphorous trichloride.

* * * * *